United States Patent [19]
Fu

[11] Patent Number: 5,959,360
[45] Date of Patent: Sep. 28, 1999

[54] INTERCONNECT STRUCTURE EMPLOYING EQUIVALENT RESISTANCE PATHS TO IMPROVE ELECTROMIGRATION RESISTANCE

[75] Inventor: Kuan-Yu Fu, Hsinchu, Taiwan

[73] Assignee: United Microelectronics Corp., Taiwan

[21] Appl. No.: 09/135,367

[22] Filed: Aug. 17, 1998

[30] Foreign Application Priority Data

May 22, 1998 [TW] Taiwan ................................. 87107992

[51] Int. Cl.$^6$ ........................... H01L 23/48; H01L 29/00; H01L 21/44; H01L 21/326

[52] U.S. Cl. ..................... 257/773; 257/775; 257/774; 257/536; 438/669; 438/468; 438/927; 438/957; 438/128; 438/761; 438/385; 438/598; 438/666; 438/622

[58] Field of Search ..................... 257/773, 536, 257/775, 774; 438/666, 927, 957, 468, 669, 128, 761, 385, 598, 622

[56] References Cited

U.S. PATENT DOCUMENTS

| | | | |
|---|---|---|---|
| 5,101,261 | 3/1992 | Maeda | 357/68 |
| 5,289,036 | 2/1994 | Nishimoto | 257/774 |
| 5,461,260 | 10/1995 | Varker et al. | 257/773 |
| 5,708,291 | 1/1998 | Bohr et al. | 257/529 |
| 5,739,587 | 4/1998 | Sato | 257/758 |
| 5,789,783 | 8/1998 | Choundhury et al. | 257/355 |

*Primary Examiner*—John F. Niebling
*Assistant Examiner*—Neal Berezny
*Attorney, Agent, or Firm*—Thomas, Kayden, Horstemeyer & Risley, LLC

[57] ABSTRACT

A structure of a conductive line. The structure of a conductive line comprises a substrate with two conductive lines formed thereon. These two conductive lines are isolated by the formation of a dielectric layer. The conductive lines are electrically connected by a contact/via array. The contact/via array further comprises contact/via columns and contact/via rows made up of contacts/vias. Each contact/via column and contact/via row are added with a load resistor, so that the equivalent resistance of each contact/via is identical.

3 Claims, 2 Drawing Sheets

INTERCONNECT STRUCTURE EMPLOYING EQUIVALENT RESISTANCE PATHS TO IMPROVE ELECTROMIGRATION RESISTANCE

CROSS-REFERENCE TO RELATED APPLICATION

This application claims the priority benefit of Taiwan application serial no. 87107992, filed May 22, 1998, the full disclosure of which is incorporated herein by reference.

BACKGROUND OF THE INVENTION

1. Field of the Invention

The invention relates to a structure of a conductive line in an integrated circuit, and more particularly to a method of improving electromigration (EM) resistance by modifying the structure of a conductive line.

2. Description of the Related Art

Integrated circuits are made of devices, such as field effect transistors (FETs) and bipolar devices formed in and on a semiconductor substrate, and the multilevel interconnect structures that are to form connections to and between the various devices in and on the semiconductor substrate. Many integrated circuits include closely spaced arrays of devices that are accessed by and connected to one or more arrays for parallel wiring lines formed above the substrate and the devices. Arrays of closely spaced wiring lines are familiar features of integrated circuit memories such as nonvolatile memories like ROM, EEPROM and flash EEPROM, dynamic random access memories (DRAM) and static random access memories because of the regularity of these circuits. Because of the requirements of routing interconnects efficiently while using as few layers of interconnects as is possible, parallel arrays of wiring lines are also featured in digital signal processors, microprocessors and even more random sorts of logic circuits.

It is very often that conductive lines are coupled with the silicon diffusion regions or other conductive lines by a contact/via. As mentioned above, because of the requirement of having as few layers of multilevel interconnects as possible, the contacts/vias are in a form of an N×M via/contact array. Considering an even distribution condition, each contact/via carriers a current flow of 1/N×M of the total input current. However, in practical use, due to the different conductive path, the equivalent resistance of each contact/via is different, so that the current flowing through each contact/via is different. As a consequence, the contact/via having a larger equivalent resistance is distributed with a smaller current, and the contact/via having a smaller equivalent resistance is distributed with a larger current. For the contact/via distributed with a larger current, the EM lifetime is shorter.

Normally, the contacts/vias are designed perpendicular to the conductive lines. In FIG. 1, a conventional vertical contact/via array is shown. The current flows into conductive line M1 through the contact/via $A_{11}$, $A_{12}$, $A_{13}$ and $A_{14}$ to the conductive line M2.

In FIG. 2, an equivalent circuit of the structure shown in FIG. 1 is shown. Assuming that a resistor r exists between each contact/via $A_{11}$, $A_{12}$, $A_{13}$ and $A_{14}$, and the resistance of each contact/via $A_{11}$, $A_{12}$, $A_{13}$ and $A_{14}$ is $r_c$. While the total current flowing into conductive line M1 is I, the relationship between the currents $I_1$, $I_2$, $I_3$ and $I_4$ flowing through each contact via $A_{11}$, $A_{12}$, $A_{13}$ and $A_{14}$ respective is represented as:

$$I_1 = \left[\left(1 + \frac{r}{r_c}\right)^3 + 2\left(\frac{(1 + r/r_c)r}{r_c}\right) + \frac{r}{r_c}\right]I_4$$

$$I_2 = \left[\left(1 + \frac{r}{r_c}\right)^2 + \frac{r}{r_c}\right]I_4$$

$$I_3 = \left(1 + \frac{r}{r_c}\right)I_4$$

Assuming that $r/r_c=0.05$, $I_1/I_4=1.31$, $I_2/I_4=1.15$, and $I_3/I_4=1.05$. The current carried by the contact/via $A_{11}$ is 1.31 times of the current carried by the contact/via $A_{14}$. According to Black's Equation, the electromigration lifetime is inversely proportional to the square of the current carried by a contact/via. Therefore, the EM lifetime of the contact/via $A_{11}$ is only $(1/1.31)^2 \approx 0.58$ times of the EM lifetime of the contact/via $A_{14}$.

In FIG. 3, a 4×4 vertical contact/via array is shown. A total current flows into the conductive lines M1 through the contact/via array composed of $A_{11}$, $A_{12}$, ..., $A_{44}$ to the conductive lines M2. Similarly, each of the contact/via $A_{11}$, $A_{12}$, ..., $A_{44}$ carries a current in accordance with the relation shown above. After normalization, the current $I_{11}$, $I_{12}$, ..., $I_{44}$ carried by each contact/via $A_{11}$, $A_{12}$, ..., $A_{44}$ in the contact/via array is:

$$\begin{bmatrix} I_{11} & I_{12} & I_{13} & I_{14} \\ I_{21} & I_{22} & I_{23} & I_{24} \\ I_{31} & I_{32} & I_{33} & I_{34} \\ I_{41} & I_{42} & I_{43} & I_{44} \end{bmatrix} = \begin{bmatrix} 1.39 & 1.19 & 1.09 & 1.03 \\ 1.19 & 1.05 & 0.96 & 0.91 \\ 1.09 & 0.96 & 0.87 & 0.83 \\ 1.03 & 0.91 & 0.83 & 0.79 \end{bmatrix}$$

As shown above, the ratio of current carried by the contact/via $A_{44}$ with a longest conductive path to the contact/via $A_{11}$ with a shortest conductive path is about $0.79/1.39 \approx 1/1.76$. Consequently, in comparison with an even distribution condition, the EM lifetime is only about $(1/1.35)^2 \approx 55\%$.

SUMMARY OF THE INVENTION

It is therefore an object of the invention to provide a structure of a conductive line. A proper load resistor is added to each contact/via, so that each contact/via has an identical equivalent resistance. Therefore, as the current distributed into each contact/via is the same, the electromigration resistance of each contact/via is uniform. The EM lifetime of the whole conductive structure is enhanced.

To achieve these objects and advantages, and in accordance with the purpose of the invention, as embodied and broadly described herein, the invention is directed towards a structure of a conductive line. The structure of a conductive line comprises a substrate with two conductive lines formed thereon. These two conductive lines are isolated by the formation of a dielectric layer. The conductive lines are electrically connected by a contact/via array. The contact/via array further comprises contact/via columns and contact/via rows made up of contacts/vias. Each contact/via column and contact/via row are added with a load resistor, so that the equivalent resistance of each contact/via is identical.

It is to be understood that both the foregoing general description and the following detailed description are exemplary and explanatory only and are not restrictive of the invention, as claimed.

DESCRIPTION OF THE PREFERRED EMBODIMENTS

In a preferred embodiment according to the invention, a structure of conductive lines is provided. A load resistor is added to each contact/via, so that the equivalent resistance thereof is identical to achieve the uniformity of the current flow. Therefore, the EM lifetime of each contact/via is enhanced. A detailed description of the invention is presented in the following paragraphs with accompanying drawings FIG. 4 and FIG. 5.

Figure 1:
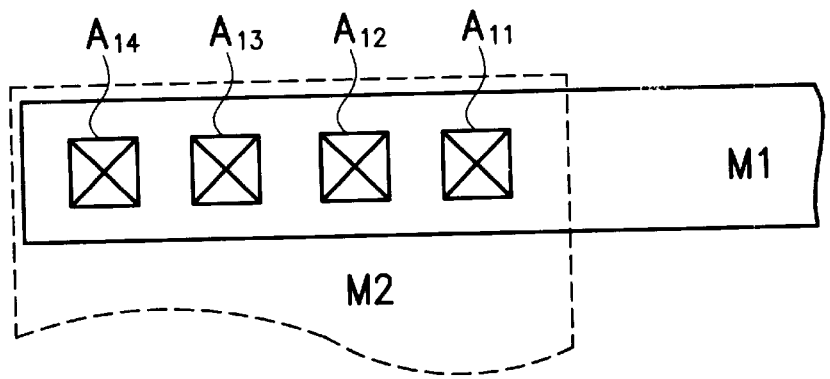
FIG. 1 shows a conventional structure of conductive lines with a 1×4 vertical contact/via array.
Figure 2:
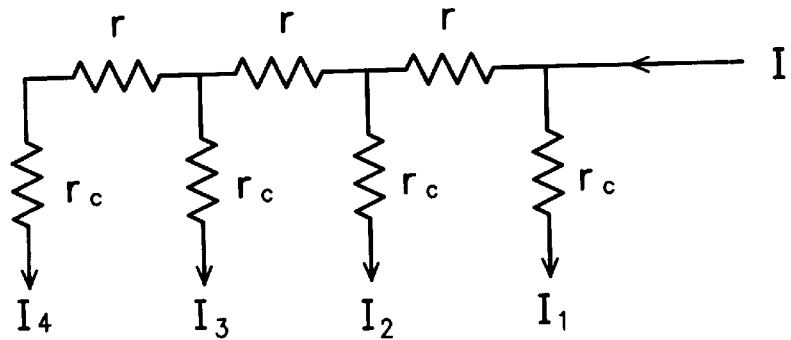
FIG. 2 is shows an equivalent circuit of the contact/via array shown in FIG. 1.
Figure 3:
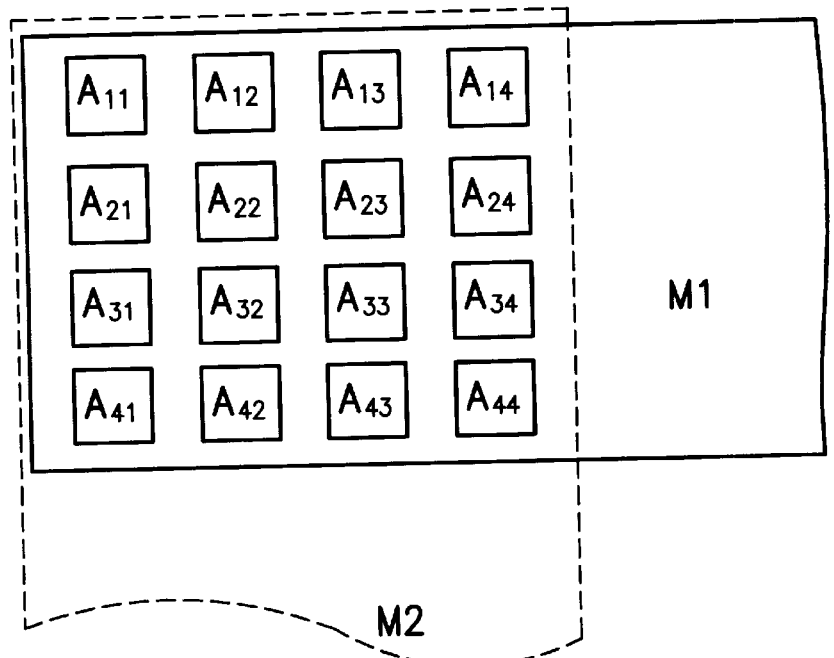
FIG. 3 shows a conventional structure of conductive lines with a 4×4 vertical contact/via array.
Figure 4:
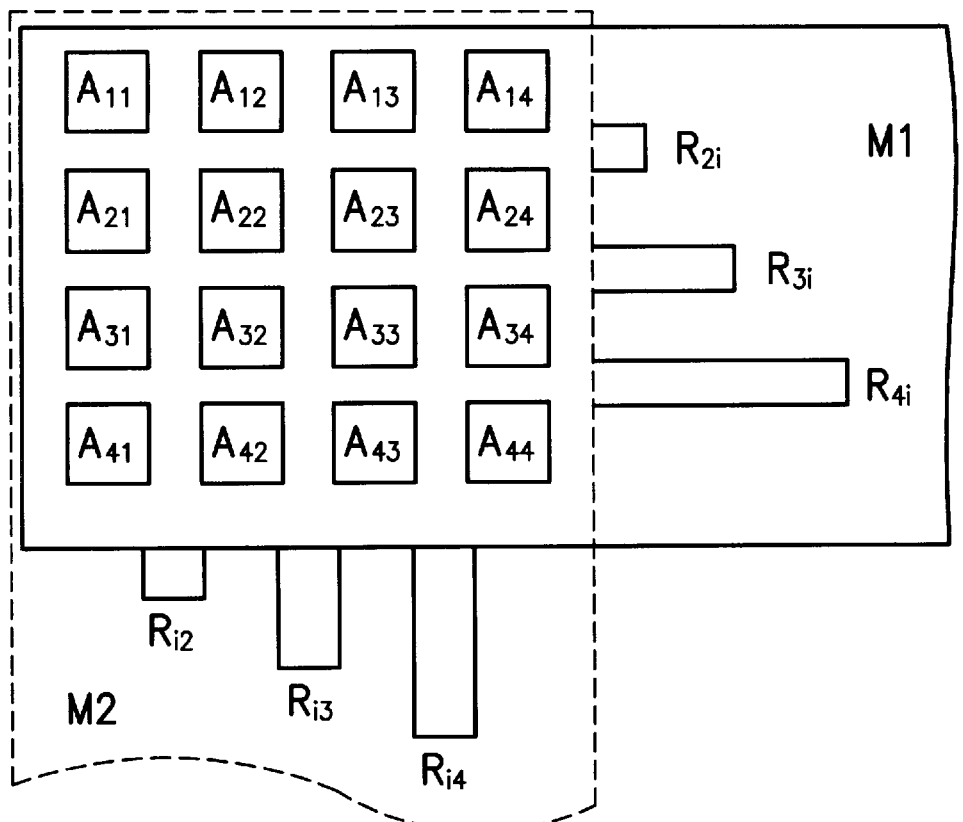
FIG. 4 shows a structure of conductive lines with a 4×4 vertical contact/via array in a preferred embodiment according to the invention.

In FIG. 4, a 4×4 contact/via array comprising 16 contacts/vias of $A_{11}$ to $A_{44}$ is formed on a substrate (not shown) to electrically connects the conductive line M1 and the conductive line M2. According to the practical requirement, a load resistor is added to each of the contacts/vias $A_{11}$, $A_{12}, \ldots, A_{44}$. As shown in the figure, these load resistors are formed by first forming a slot in each column and row of contacts/vias. For example, in the first contact/via column and row, none of the slots is inserted. In the second to the fourth contact/via rows $A_{2i}$ to $A_{4i}$, slots $R_{2i}$ to $R_{4i}$ are inserted respectively, and in the second to the fourth contact/via column $A_{i2}$ to $A_{i4}$, slots $R_{i2}$ to $R_{i4}$ are inserted respective. These slots $R_{2i}$ to $R_{4i}$ and $R_{i2}$ to $R_{i4}$ are then filled with dielectric material.

Figure 5:
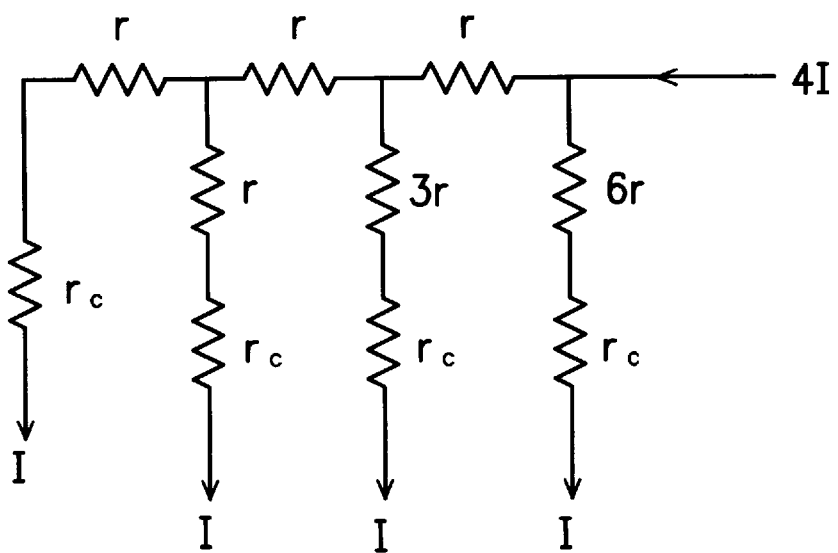
FIG. 5 shows an equivalent circuit of the structure shown in FIG. 4.

Assuming that each contact/via $A_{11}, A_{12}, \ldots, A_{44}$ has a resistance of $r_c$, and an equivalent resistor exists between each contact/via $A_{11}, A_{12}, \ldots, A_{44}$, according to the equivalent circuit shown in FIG. 5, taking the first row as an example, a zero resistance is added to the first contact/via element $A_{11}$ with the highest equivalent resistance. With the second contact/via element $A_{12}$ with a second highest equivalent resistance, a load resistor of resistance r is serially connected. A load resistor of resistance of 3r is serially connected with the third contact/via element $A_{13}$, and a load resistor of resistance of 6r is serially connected with the fourth contact/via element $A_{14}$. Thus, each of the contact/via $A_{11}$ to $A_{44}$ has an identical equivalent resistance. When a total current of 4I is input into the conductive line M1, each contact/via $A_{11}$ to $A_{14}$ is distributed with a current of I.

With the structure of conductive lines mentioned above, each contact/via in a contact/via array carries an identical current. Thus, the EM lifetime inversely proportional to the square of the current is identical of each contact/via. Therefore, the electromigration resistance of the device is enhanced.

On the other hand, it is worth noting that in many fabricating processes, a structure similar to the slots filled with dielectric material in the invention is formed to relieve the stress of the conductive lines. However, the main subject and function are different. Furthermore, the slots in the invention have to be formed under the consideration of an identical equivalent resistance of each contact/via. Therefore, in the invention, the formation of the slots do not only provides an equivalent resistance of each contact via, but also provides a way to relieve the stress of the conductive lines.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A structure of conductive lines, in a semiconductor device comprising:

a substrate;

two conductive lines, formed on a substrate of the semiconductor device;

a dielectric layer, isolating the two conductive lines;

a contact/via array, electrically connecting the two conductive lines, wherein the contact/via array comprises a plurality of contact/via columns and a plurality of contact/via rows made up of a plurality of contacts/vias; and a plurality of load resistors, connected serially connecting with each of the contact/via columns and the contact/via rows, to form equivalent resistance respectively.

2. The structure according to claim 1, wherein the equivalent resistance are determined by each of the contacts/vias serially connected therewith.

3. The structure according to claim 1, wherein the load resistors comprise a plurality of slots filled with dielectric material.

* * * * *